(12) United States Patent
Kiuchi et al.

(10) Patent No.: US 11,450,548 B2
(45) Date of Patent: Sep. 20, 2022

(54) WAFER PROCESSING METHOD

(71) Applicant: DISCO CORPORATION, Tokyo (JP)

(72) Inventors: Hayato Kiuchi, Tokyo (JP); Keisuke Yamamoto, Tokyo (JP); Taichiro Kimura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/421,556

(22) Filed: May 24, 2019

(65) Prior Publication Data

US 2019/0378746 A1   Dec. 12, 2019

(30) Foreign Application Priority Data

Jun. 6, 2018   (JP) .............................. JP2018-108902

(51) Int. Cl.
| | |
|---|---|
| *H01L 21/683* | (2006.01) |
| *C09J 5/06* | (2006.01) |
| *C09J 7/35* | (2018.01) |
| *H01L 21/304* | (2006.01) |
| *H01L 21/67* | (2006.01) |
| *H01L 21/78* | (2006.01) |
| *H01L 23/544* | (2006.01) |

(52) U.S. Cl.
CPC ............ *H01L 21/6836* (2013.01); *C09J 5/06* (2013.01); *C09J 7/35* (2018.01); *H01L 21/304* (2013.01); *H01L 21/67092* (2013.01); *H01L 21/67132* (2013.01); *H01L 21/78* (2013.01); *H01L 23/544* (2013.01); *C09J 2203/326* (2013.01);
(Continued)

(58) Field of Classification Search
CPC ... H01L 21/6836; H01L 21/304; H01L 21/78; H01L 21/67132; H01L 21/67092; H01L 23/544; H01L 2223/5446; H01L 2221/68327; H01L 2221/68381; H01L 2221/6834; H01L 21/6835; H01L 21/02; C09J 5/06; C09J 7/35; C09J 2301/502;
(Continued)

(56) References Cited

U.S. PATENT DOCUMENTS

| | | | |
|---|---|---|---|
| 5,668,400 A * | 9/1997 | Quinn | .................... B41J 2/155 |
| | | | 257/618 |
| 10,847,420 B2 | 11/2020 | Harada et al. | |

(Continued)

FOREIGN PATENT DOCUMENTS

| | | |
|---|---|---|
| JP | 2004296839 A | 10/2004 |
| JP | 2005246491 | 9/2005 |
| JP | 2005246491 A | 9/2005 |

OTHER PUBLICATIONS

Kiuchi, Hayato, U.S. Appl. No. 16/438,766, filed Jun. 12, 2019.

*Primary Examiner* — Benjamin Tzu-Hung Liu
(74) *Attorney, Agent, or Firm* — Greer Burns & Crain, Ltd.

(57) ABSTRACT

A wafer processing method includes a wafer providing step of placing a polyolefin or polyester sheet on an upper surface of a substrate for supporting a wafer and placing the wafer on an upper surface of the sheet in a condition where a back side of the wafer is exposed upward, a thermocompression bonding step of setting the wafer placed through the sheet on the substrate in an enclosed environment, next evacuating the enclosed environment, and next heating the sheet as applying a pressure to the wafer, thereby uniting the wafer through the sheet to the substrate by thermocompression bonding, a back processing step of processing the back side of the wafer supported through the sheet to the substrate, and a separating step of separating the wafer from the sheet bonded to the substrate.

24 Claims, 4 Drawing Sheets

(52) U.S. Cl.
CPC ...... *C09J 2301/502* (2020.08); *C09J 2423/04* (2013.01); *C09J 2423/10* (2013.01); *C09J 2425/00* (2013.01); *C09J 2467/00* (2013.01); *H01L 2221/68327* (2013.01); *H01L 2223/5446* (2013.01)

(58) Field of Classification Search
CPC .............. C09J 2467/00; C09J 2203/326; C09J 2423/04; C09J 2423/10; C09J 2425/00
See application file for complete search history.

(56) References Cited

U.S. PATENT DOCUMENTS

| | | | |
|---|---|---|---|
| 2004/0192012 A1* | 9/2004 | Takezoe | H01L 21/6835 438/460 |
| 2008/0308225 A1* | 12/2008 | Kanamaru | C09J 163/00 156/322 |
| 2009/0039533 A1* | 2/2009 | Lin | H01L 23/49838 257/783 |
| 2009/0191029 A1* | 7/2009 | Lim | H01L 21/67132 414/217 |
| 2011/0187009 A1* | 8/2011 | Masuko | C08G 73/1082 257/798 |
| 2016/0257861 A1* | 9/2016 | Oliver | C09J 11/06 |
| 2017/0152408 A1* | 6/2017 | Kirikae | H01L 21/6836 |
| 2017/0198176 A1* | 7/2017 | Kamochi | B32B 27/285 |
| 2019/0378758 A1 | 12/2019 | Harada et al. | |
| 2019/0385887 A1 | 12/2019 | Kiuchi et al. | |
| 2019/0393089 A1 | 12/2019 | Zhao | |

* cited by examiner

WAFER PROCESSING METHOD

BACKGROUND OF THE INVENTION

Field of the Invention

The present invention relates to a wafer processing method for processing the back side of a wafer supported to a substrate.

Description of the Related Art

In processing a wafer having a plurality of devices such as integrated circuits (ICs) and large-scale integrations (LSIs) on the front side thereof, the plurality of devices being separated from each other by a plurality of crossing division lines formed on the front side of the wafer, the back side of the wafer is ground by using a grinding apparatus to thereby reduce the thickness of the wafer to a predetermined thickness. Thereafter, the wafer is divided along the division lines by using a dicing apparatus (dicing saw) to thereby obtain a plurality of individual device chips. These device chips are used in electrical equipment such as mobile phones and personal computers.

In recent years, various kinds of device chips have been reduced in size and weight to meet the demand for a reduction in size and weight of electrical equipment. Accordingly, the thickness of the wafer tends to become as small as possible, to be 50 μm or 30 μm, for example.

In the case of reducing the thickness of the wafer by using a grinding apparatus, there is a problem such that the strength of the wafer is decreased with a decrease in wafer thickness, causing an increased possibility of damage to the wafer in grinding the wafer or in transferring the wafer after grinding. To cope with this problem, the present applicant (assignee) has proposed a technique including the steps of supporting the wafer to a substrate having a rigidity higher than that of the wafer and next grinding the back side of the wafer to reduce the thickness of the wafer (see Japanese Patent Laid-open No. 2004-296839).

SUMMARY OF THE INVENTION

In the technique described in Japanese Patent Laid-open No. 2004-296839, a liquid resin is applied to the front side of the wafer to form an adhesive layer, and the wafer is united through this adhesive layer to the substrate. However, in the case of using the liquid resin to unite the wafer and the substrate, there is a problem such that a supporting force for supporting the wafer to the substrate is insufficient, so that the wafer cannot be stably held on a holding table in grinding the back side of the wafer, causing possible damage to the wafer in grinding. As other means for uniting the wafer and the substrate, a double-sided adhesive tape or a wax, for example, may be used. However, also in this case, a supporting force for supporting the wafer to the substrate is insufficient as in the case of using the above-mentioned liquid resin, causing a similar problem.

In the case that a plurality of projection electrodes called bumps are formed on the front side of each device formed on the front side of the wafer, there arises a problem such that stress may be concentrated at the bumps in grinding the wafer unless the wafer is stably supported to the substrate, causing possible damage to the wafer.

Further, in separating the substrate from the front side of the wafer after finishing the grinding, there is a problem such that the liquid resin, adhesive of the double-sided adhesive tape, or wax may be left on the front side of the wafer due to adhesion, causing a degradation in quality of each device. Accordingly, a step of removing the liquid resin, adhesive, or wax from the front side of the wafer must be added after separating the substrate from the wafer, causing a reduction in productivity.

It is therefore an object of the present invention to provide a wafer processing method which can ensure a sufficient supporting force for supporting the wafer to the substrate and can also prevent a degradation in quality of each device after separating the substrate from the wafer, without a reduction in productivity.

In accordance with an aspect of the present invention, there is provided a wafer processing method for processing a back side of a wafer having a plurality of devices on a front side thereof, the plurality of devices being separated from each other by a plurality of crossing division lines formed on the front side of the wafer, the wafer processing method including a wafer providing step of placing a thermoplastic polymer sheet on an upper surface of a substrate for supporting the wafer, and placing the wafer on an upper surface of the thermoplastic polymer sheet in a condition where the back side of the wafer is exposed upward, a thermocompression bonding step of setting the wafer placed through the polymer sheet on the substrate in an enclosed environment after performing the wafer providing step, next evacuating the enclosed environment, and next heating the polymer sheet as applying a pressure to the wafer, thereby uniting the wafer through the polymer sheet to the substrate by thermocompression bonding, a back processing step of processing the back side of the wafer after performing the thermocompression bonding step; and a separating step of separating the wafer from the polymer sheet after performing the back processing step.

Preferably, the back processing step includes a grinding step of grinding the back side of the wafer. Preferably, the thermoplastic polymer sheet is a polyolefin sheet or a polyester sheet. Preferably, the polyolefin sheet is formed of polyethylene, polypropylene, or polystyrene. In the case that the polyolefin sheet is formed of polyethylene, the polyolefin sheet is preferably heated to a temperature in the range of 120° C. to 140° C. in the thermocompression bonding step. In the case that the polyolefin sheet is formed of polypropylene, the polyolefin sheet is preferably heated to a temperature in the range of 160° C. to 180° C. in the thermocompression bonding step. In the case that the polyolefin sheet is formed of polystyrene, the polyolefin sheet is preferably heated to a temperature in the range of 220° C. to 240° C. in the thermocompression bonding step.

Preferably, the polyester sheet is formed of polyethylene terephthalate or polyethylene naphthalate. In the case that the polyester sheet is formed of polyethylene terephthalate, the polyester sheet is preferably heated to a temperature in the range of 250° C. to 270° C. in the thermocompression bonding step. In the case that the polyester sheet is formed of polyethylene naphthalate, the polyester sheet is preferably heated to a temperature in the range of 160° C. to 180° C. in the thermocompression bonding step.

Preferably, a pressure is applied to the wafer such that a raised portion surrounding an outer circumference of the wafer is formed along an outer circumference of the polymer sheet in the thermocompression bonding step.

According to the present invention, the wafer can be supported to the substrate with a sufficient supporting force, so that possible damage to the wafer can be prevented in processing the back side of the wafer. Further, even when a plurality of bumps are formed on the front side of each device, the wafer can be reliably supported to the substrate in the condition where the bumps are embedded in the sheet softened by heating. Accordingly, stress applied to the wafer in the back processing step can be dispersed to thereby prevent possible damage to the bumps and the wafer.

Further, according to the processing method of the present invention, the wafer is united through the sheet to the substrate by thermocompression bonding. Accordingly, even in separating the sheet and the substrate from the front side of the wafer after performing the back processing step, there is no possibility that a liquid resin, adhesive, or wax may be left on the bumps. Accordingly, a degradation in quality of each device can be prevented.

The above and other objects, features, and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1A:
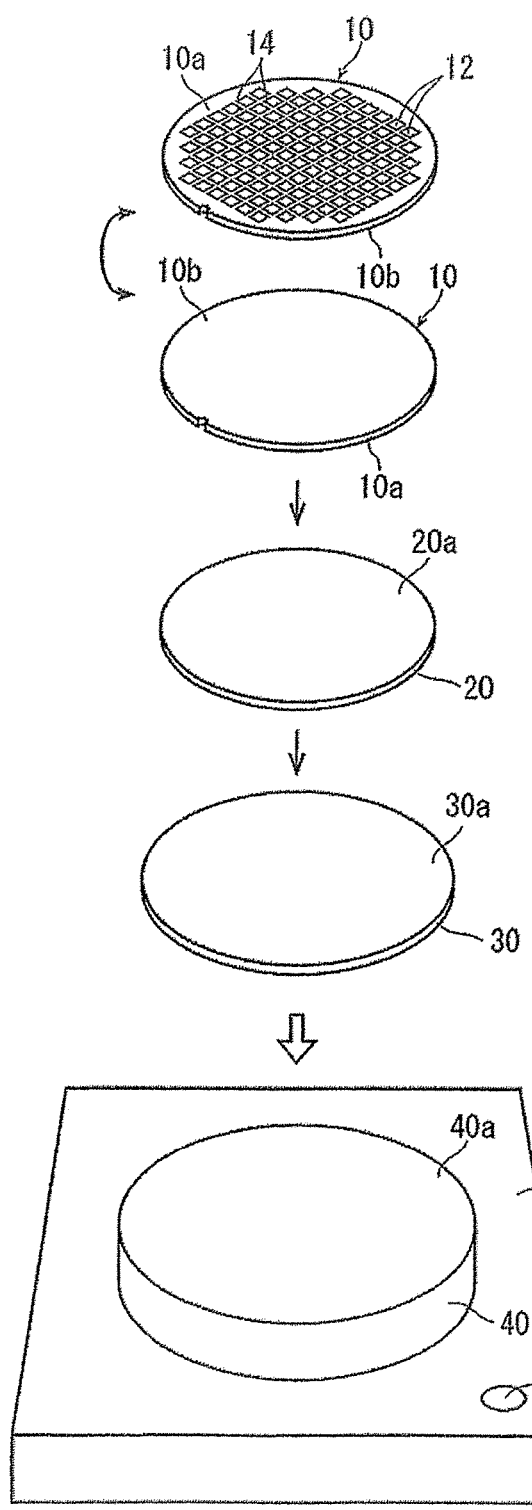
FIG. 1A is an exploded perspective view illustrating a manner of performing a wafer providing step in a wafer processing method according to a preferred embodiment of the present invention.

A preferred embodiment of the wafer processing method according to the present invention will now be described in detail with reference to the attached drawings. This preferred embodiment is a processing method for grinding the back side of a wafer. Prior to performing the wafer processing method according to this preferred embodiment, a circular wafer 10 as a workpiece is prepared as illustrated in FIG. 1A. As illustrated in FIG. 1A, the wafer 10 has a front side 10*a* and a back side 10*b*. A plurality of crossing division lines 14 are formed on the front side 10*a* of the wafer 10 to thereby define a plurality of separate regions where a plurality of devices 12 are individually formed. Further, a circular sheet 20 as a thermoplastic polymer sheet and a circular substrate 30 for supporting the wafer 10 are prepared. The sheet 20 has a front side 20*a* and a back side 20*b*. The substrate 30 has a front side 30*a* and a back side 30*b*.

(Wafer Providing Step)

Figure 1B:
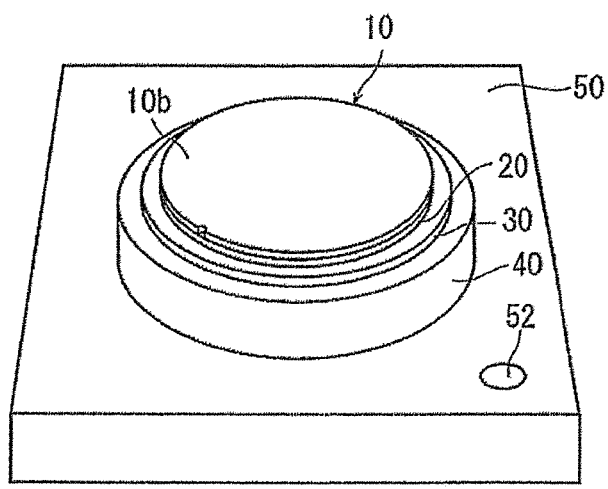
FIG. 1B is a perspective view illustrating a condition where a wafer is placed through a sheet on a substrate in the wafer providing step illustrated in FIG. 1A.

After preparing the wafer 10, the sheet 20, and the substrate 30, the sheet 20 is placed on the front side 30*a* (upper surface as viewed in FIG. 1A) of the substrate 30 in the condition where the front side 20*a* (upper surface as viewed in FIG. 1A) of the sheet 20 is oriented upward. Further, the wafer 10 is placed on the front side 20*a* of the sheet 20 in the condition where the back side 10*b* of the wafer 10 is oriented upward, that is, the front side 10*a* of the wafer 10 is oriented downward. The sheet 20 has substantially the same size (diameter) as that of the wafer 10. The sheet 20 is a polyolefin sheet or a polyester sheet. In this preferred embodiment, a polyethylene (PE) sheet as an example of the polyolefin sheet is selected for the sheet 20. The substrate 30 is formed of polyethylene terephthalate (PET) in this preferred embodiment. The substrate 30 preferably has a size (diameter) larger than that of the wafer 10 and the sheet 20. The substrate 30 preferably has a thickness capable of providing a rigidity higher than that of the wafer 10 and the sheet 20. In performing the wafer providing step, a circular heater table 40 having a front side 40*a* is provided on the upper surface of a rectangular base 50 at a central portion thereof in the condition where the front side 40*a* is oriented upward. The substrate 30 is placed on the front side 40*a* of the heater table 40 at a central portion thereof (see FIG. 1B). The heater table 40 contains a temperature sensor and an electric heater (both not illustrated), which are connected to a control unit and a power source (both not illustrated), whereby the temperature of the heater table 40 can be adjusted to a desired temperature.

(Thermocompression Bonding Step)

Figure 2A:
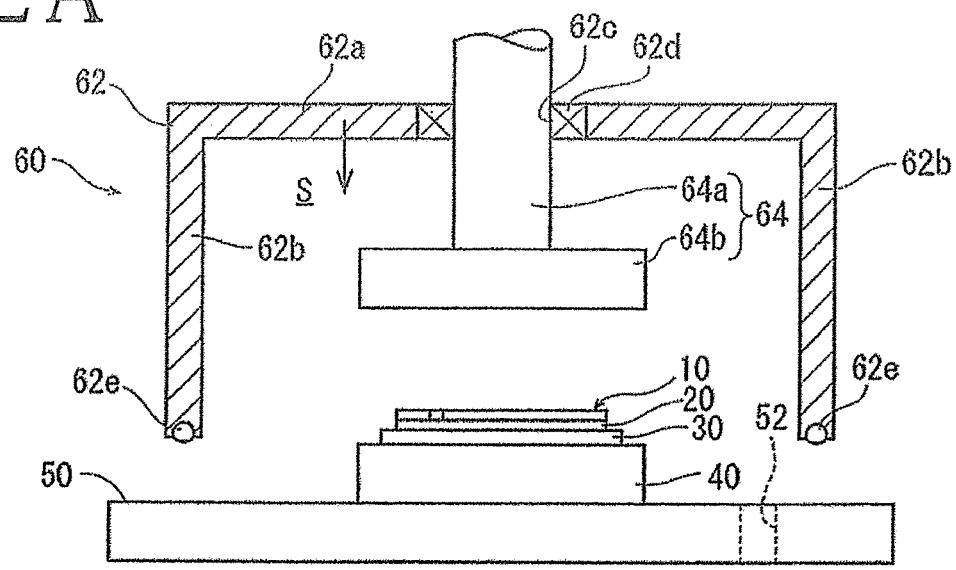
FIGS. 2A, 2B, and 2C are partially sectional side views for illustrating a thermocompression bonding step in the wafer processing method according to this preferred embodiment.
Figure 2B:
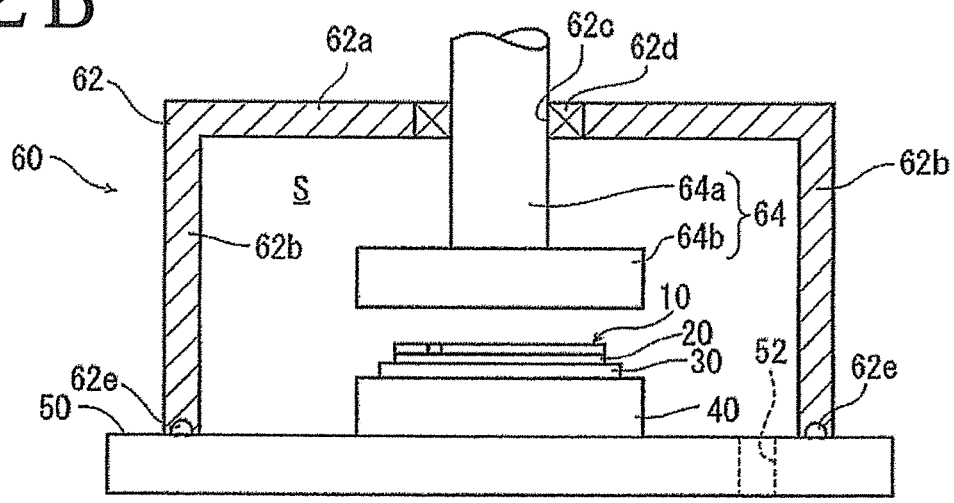
Figure 2C:
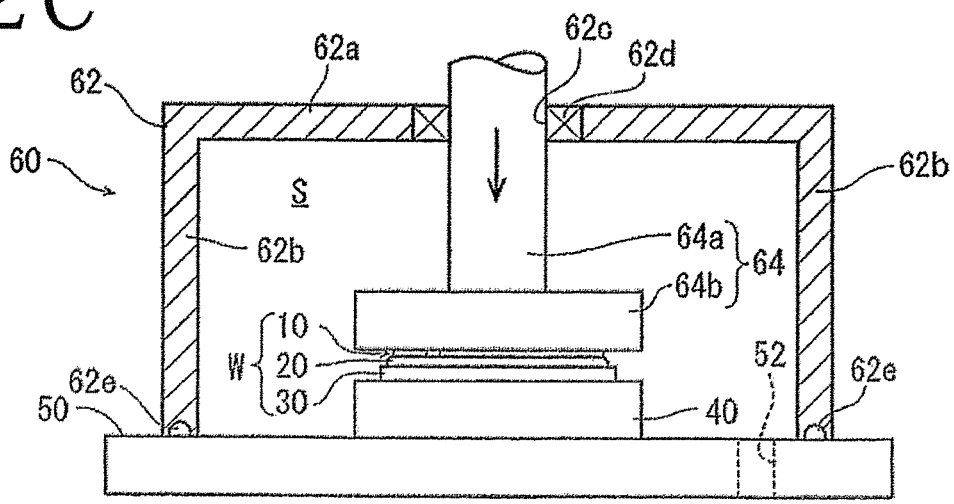

After performing the wafer providing step, a thermocompression bonding step is performed as illustrated in FIGS. 2A, 2B, and 2C. The thermocompression bonding step is the step of setting the wafer 10 supported through the sheet 20 on the substrate 30 in an enclosed environment, next evacuating this enclosed environment, and next heating the sheet 20 as applying a pressure to the wafer 10, thereby uniting the wafer 10 through the sheet 20 to the substrate 30. The thermocompression bonding step will now be described more specifically.

As illustrated in FIG. 2A, the thermocompression bonding step is performed by using a thermocompression bonding apparatus 60. The thermocompression bonding apparatus 60 includes an enclosing cover member 62 for forming an enclosed environment in cooperation with the base 50 in the condition where the heater table 40 is set in this enclosed environment. In FIGS. 2A to 2C, only the enclosing cover member 62 is illustrated in vertical section for convenience of illustration of the internal configuration. The enclosing cover member 62 is a box-shaped member configured to cover the whole of the upper surface of the base 50 in such a manner that the substrate 30 placed on the heater table 40 provided on the base 50 can be surrounded by the enclosing cover member 62. The enclosing cover member 62 has a rectangular upper wall 62*a* and a rectangular cylindrical side wall 62*b* extending downward from the outer periphery of the rectangular upper wall 62*a*. The enclosing cover member 62 is open at its bottom end opposite to the upper wall 62*a*. The upper wall 62*a* has a central opening 62*c* for insertion of a support shaft 64*a* of a pressure member 64. The support shaft 64*a* of the pressure member 64 is vertically movably inserted through the central opening 62*c* of the upper wall 62*a*. Further, a seal structure 62*d* is interposed between the support shaft 64*a* and the upper wall 62*a* so as to seal the gap therebetween in the central opening 62c. The seal structure 62d allows the vertical movement of the support shaft 64a and the hermetic seal of an inside space S of the enclosing cover member 62 for the formation of the enclosed environment. A pressure applying plate 64b is connected to the lower end of the support shaft 64a. Thus, the pressure member 64 is composed of the support shaft 64a and the pressure applying plate 64b. The pressure applying plate 64b is a circular member essentially having a diameter larger than that of the wafer 10. Preferably, the diameter of the pressure applying plate 64b is set slightly larger than that of the heater table 40. Further, an elastic seal member 62e is provided on the lower end surface of the side wall 62b of the enclosing cover member 62 so as to extend over the periphery of the side wall 62b. The elastic seal member 62e functions to seal the inside space S of the enclosing cover member 62 in cooperation with the base 50. Although not illustrated, drive means for vertically moving the pressure member 64 is provided above the pressure member 64.

After the wafer 10 is placed through the sheet 20 and the substrate 30 on the heater table 40 set on the base 50, the enclosing cover member 62 is positioned above the base 50 so as to surround the heater table 40 as illustrated in FIG. 2A. Thereafter, the enclosing cover member 62 is lowered until the lower end surface of the side wall 62b comes into abutment against the upper surface of the base 50 as illustrated in FIG. 2B. Thus, the enclosing cover member 62 is placed on the upper surface of the base 50 so as to enclose the inside space S in which the wafer 10 is set. At this time, the pressure applying plate 64b is positioned above the upper surface of the wafer 10 as illustrated in FIG. 2B. When the enclosing cover member 62 is placed on the base 50, the elastic seal member 62e provided on the lower end surface of the side wall 62b comes into close contact with the upper surface of the base 50, thereby effecting hermetic seal. The base 50 has a suction hole 52 in the vicinity of the heater table 40. The suction hole 52 is connected to suction means (not illustrated). Accordingly, the inside space S defined by the enclosing cover member 62 in cooperation with the base 50 is connected through the suction hole 52 to the suction means.

In this manner, the enclosing cover member 62 is placed on the base 50 to thereby make the inside space S of the enclosing cover member 62 into an enclosed environment as illustrated in FIG. 2B. Thereafter, the suction means is operated to suck the air present in the inside space S through the suction hole 52, thereby evacuating the inside space S where the wafer 10 is set to obtain a nearly vacuum condition. At the same time, the electric heater contained in the heater table 40 is operated to heat the sheet 20 placed on the substrate 30 and interposed between the wafer 10 and the substrate 30. At this time, the temperature of the heater table 40 is controlled by the temperature sensor and the control unit (both not illustrated) to heat the sheet 20 to a temperature (120° C. to 140° C.) near the melting point of a polyethylene sheet in this preferred embodiment. As a modification, a temperature sensor for directly detecting the temperature of the sheet 20 may be provided instead. As heating the sheet 20 as mentioned above, the pressure applying plate 64b is lowered to apply a uniform pressure to the whole upper surface of the wafer 10 as illustrated in FIG. 2C. Since the inside space S where the wafer 10 is present has been evacuated to a nearly vacuum condition, the air left between the wafer 10 and the sheet 20 is sucked off. Further, the sheet 20 has been heated to the above temperature to become soft, so that the wafer 10 is united through the sheet 20 to the substrate 30 by thermocompression bonding, thereby forming a wafer unit W. That is, the wafer unit W is composed of the wafer 10, the sheet 20, and the substrate 30 united together. In this manner, the thermocompression bonding step is finished. After finishing the thermocompression bonding step, the operation of the suction means is stopped and the operation of the electric heater in the heater table 40 is also stopped. Thereafter, the pressure applying plate 64b is raised, and the enclosing cover member 62 is also raised. When the temperature of the sheet 20 is lowered to a temperature near room temperature, the wafer unit W can be unloaded from the heater table 40.

Figure 3:
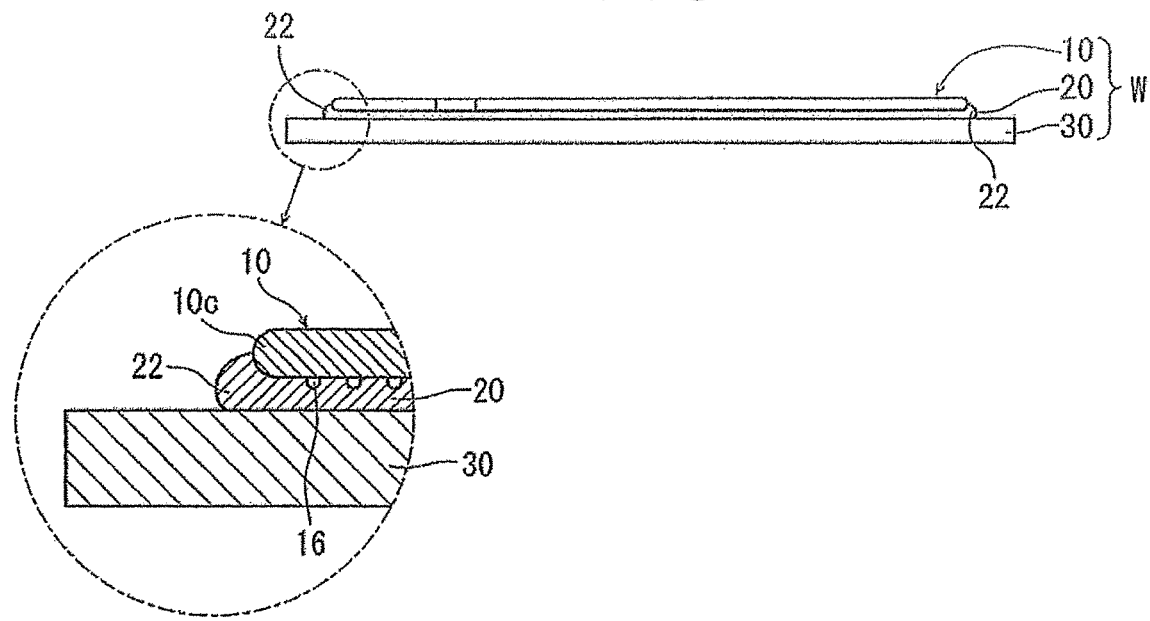
FIG. 3 is a side view of a wafer unit obtained by the thermocompression bonding step illustrated in FIGS. 2A to 2C, in which a part of the wafer unit is illustrated in enlarged section in an encircled area.

The wafer unit W formed by performing the thermocompression bonding step will now be described in more detail with reference to FIG. 3. As described above, the sheet 20 is heated in an enclosed environment under vacuum and thereby softened in the thermocompression bonding step. Further, a pressure is applied to the wafer 10 in the condition where the sheet 20 has been softened in the thermocompression bonding step, so that the wafer 10 is tightly bonded through the sheet 20 to the substrate 30. Accordingly, the wafer 10 can be supported to the substrate 30 having high rigidity with a sufficient supporting force. Further, even when a plurality of bumps 16 are formed on each device 12 formed on the front side 10a of the wafer 10, the bumps 16 are embedded in the sheet 20 in its soft condition obtained by heating as illustrated in an encircled part P in FIG. 3. The encircled part P is an enlarged sectional view of an end portion (peripheral portion) of the wafer unit W. The air present in the vicinity of each bump 16 is completely sucked off, and the wafer 10 is pressed on the sheet 20 in its soft condition. Accordingly, the wafer 10 can be tightly bonded through the sheet 20 to the substrate 30. As a result, the peripheral portion of the sheet 20 is raised as illustrated by reference numeral 22 in the encircled part P in FIG. 3. That is, the outer circumference 10c of the wafer 10 is surrounded by the raised portion 22 of the sheet 20.

(Back Processing Step)

After performing the thermocompression bonding step, a back processing step is performed to grind the back side 10b of the wafer 10 in the condition of the wafer unit W. The back processing step will now be described with reference to FIGS. 4A and 4B.

Figure 4A:
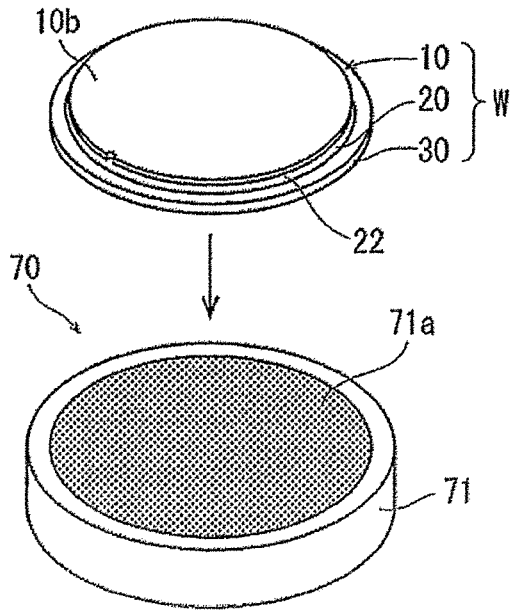
FIGS. 4A and 4B are perspective views illustrating a back processing step in the wafer processing method according to this preferred embodiment.

As illustrated in FIG. 4A, the wafer unit W obtained by the thermocompression bonding step is transferred to a grinding apparatus 70 (part of which being illustrated) for performing the back processing step. The grinding apparatus 70 includes a chuck table 71 having a vacuum chuck 71a. The wafer unit W is placed on the vacuum chuck 71a of the chuck table 71 in the condition where the substrate 30 is oriented downward, that is, the back side 10b of the wafer 10 is oriented upward. The vacuum chuck 71a is formed of porous ceramic having gas permeability. The vacuum chuck 71a is connected to suction means (not illustrated) for producing a vacuum. By operating this suction means, the wafer unit W placed on the vacuum chuck 71a is held under suction through the vacuum chuck 71a on the chuck table 71.

Figure 4B:
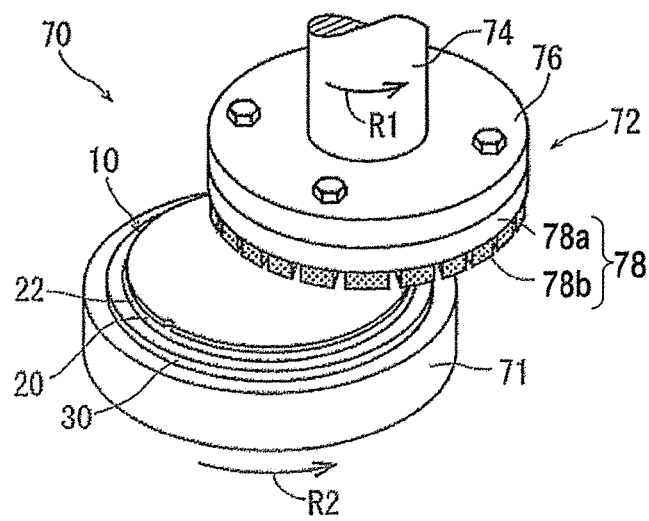

After holding the wafer unit W on the chuck table 71 under suction, the back side 10b of the wafer 10 is ground by the grinding apparatus 70 as illustrated in FIG. 4B. As illustrated in FIG. 4B, the grinding apparatus 70 further includes a grinding unit 72 for grinding the back side 10b of the wafer 10 of the wafer unit W held on the chuck table 71 under suction, thereby reducing the thickness of the wafer 10 to a predetermined thickness. The grinding unit 72 includes a spindle 74 adapted to be rotated by a rotational drive mechanism (not illustrated), a mounter 76 fixed to the lower end of the spindle 74, and a grinding wheel 78 mounted on the lower surface of the mounter 76. The grinding wheel 78 is composed of an annular base 78a mounted on the lower surface of the mounter 76 and a plurality of abrasive members 78b fixed to the lower surface of the annular base 78a so as to be arranged annularly along the outer circumference of the annular base 78a.

In the condition where the wafer unit W is held on the chuck table 71 under suction in such a manner that the back side 10b of the wafer 10 is exposed upward, the spindle 74 of the grinding unit 72 is rotated at 6000 rpm, for example, in the direction illustrated by an arrow R1 in FIG. 4B, and the chuck table 71 is also rotated at 300 rpm, for example, in the direction illustrated by an arrow R2 in FIG. 4B. Thereafter, the grinding unit 72 is lowered to bring the abrasive members 78b of the grinding wheel 78 into contact with the back side 10b of the wafer 10. Then, the grinding wheel 78 is fed at an in-feed speed of 1 μm/s, for example, in the direction perpendicular to the upper surface of the chuck table 71. At this time, the thickness of the wafer 10 may be measured by using a contact type measuring gauge (not illustrated) as grinding the back side 10b of the wafer 10. Accordingly, the back side 10b of the wafer 10 is ground until the thickness of the wafer 10 is reduced to a predetermined thickness, e.g., 50 μm. In this manner, the back processing step is finished.

(Separating Step)

Figure 5A:
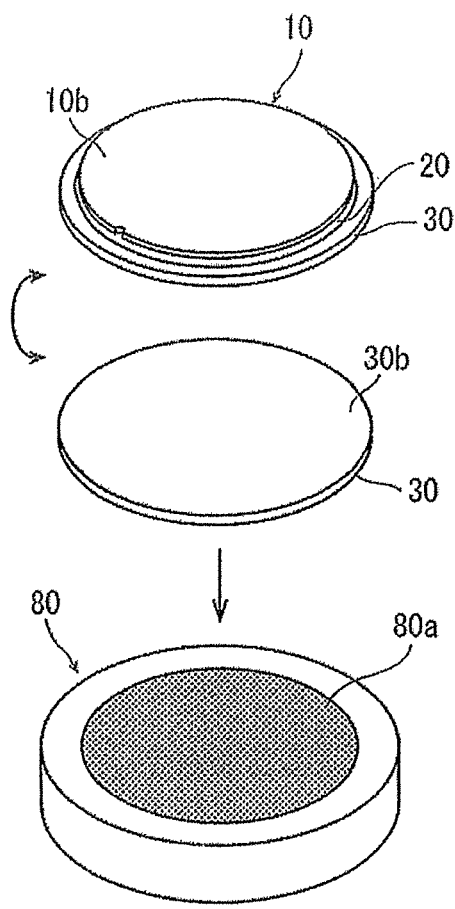
FIGS. 5A and 5B are perspective views illustrating a separating step in the wafer processing method according to this preferred embodiment.

After finishing the back processing step, a separating step is performed to separate the wafer 10 from the sheet 20. The separating step will now be described with reference to FIGS. 5A and 5B. After the back side 10b of the wafer 10 in the condition of the wafer unit W is ground to be thinned in the back processing step, the wafer unit W is unloaded from the chuck table 71 of the grinding apparatus 70. Thereafter, the wafer unit W is transferred to a chuck table 80 having a vacuum chuck 80a illustrated in FIG. 5A. The chuck table 80 is dedicated to separation of the wafer 10. Prior to loading the wafer unit W onto the chuck table 80, the wafer unit W is inverted as illustrated in FIG. 5A. Thereafter, the wafer unit W is placed on the vacuum chuck 80a of the chuck table 80 in the condition where the back side 30b of the substrate 30 is oriented upward, that is, the back side 10b of the wafer 10 is oriented downward. The chuck table 80 is similar in configuration to the chuck table 71 of the grinding apparatus 70 except the following point. While the vacuum chuck 71a of the chuck table 71 has the same diameter as that of the substrate 30, the vacuum chuck 80a of the chuck table 80 has the same diameter as that of the wafer 10.

Figure 5B:
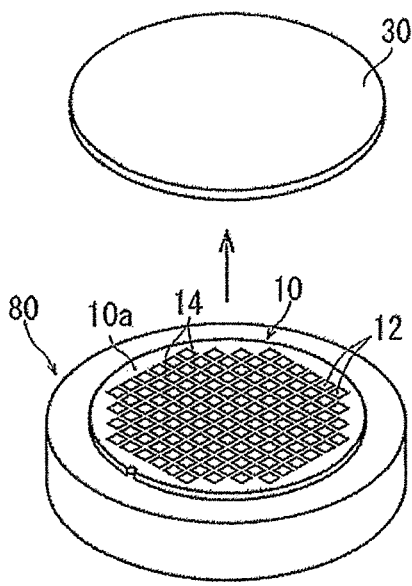

By operating suction means (not illustrated) connected to the vacuum chuck 80a of the chuck table 80, the wafer 10 of the wafer unit W is held on the vacuum chuck 80a under suction. Thereafter, the substrate 30 and the sheet 20 are separated together from the wafer 10 as illustrated in FIG. 5B. In this preferred embodiment, the substrate 30 is formed of resin (polyethylene terephthalate), so that the substrate 30 can be bent (curved) when it is separated from the wafer 10. Accordingly, the substrate 30 can be separated conveniently from the wafer 10. Further, the sheet 20 can be softened by heating. Accordingly, in performing the separating step, the sheet 20 may be heated to be softened, thereby facilitating the separation of the substrate 30. In the case that the sheet 20 is left on the wafer 10 and only the substrate 30 is separated in the separating step, the sheet 20 left may be separated from the wafer 10 by using an adhesive tape or the like in the condition where the wafer 10 is held on the chuck table 80 under suction, after separating the substrate 30. Further, while the sheet 20 is heated in separating the substrate 30 from the wafer 10 in the above description, the sheet 20 may be cooled in the separating step. That is, there is a case that the adhesion of the sheet 20 is reduced by cooling the sheet 20, according to the material of the sheet 20. In this case, the sheet 20 may be cooled to reduce its adhesion in the separating step. Accordingly, whether the sheet 20 is to be heated or to be cooled may be selected according to the characteristics of the material of the sheet 20.

According to this preferred embodiment, the wafer 10 is bonded through the sheet 20 to the substrate 30 by performing the thermocompression bonding step, so that the wafer 10 can be supported through the sheet 20 to the substrate 30 with a sufficient supporting force. Accordingly, in the back processing step of grinding the back side 10b of the wafer 10, possible damage to the wafer 10 can be prevented. Further, even when a plurality of bumps are formed on each device 12 formed on the front side 10a of the wafer 10, the air present between the front side 10a of the wafer 10 and the sheet 20 can be sucked off and the bumps can be embedded in the sheet 20 softened by heating in the thermocompression bonding step. Accordingly, the wafer 10 can be uniformly supported to the substrate 30, so that stress applied to the wafer 10 in grinding the back side 10b can be dispersed to thereby prevent possible damage to the wafer 10 and the bumps. In this preferred embodiment, the wafer 10 is supported through the sheet 20 to the substrate 30 by thermocompression bonding. That is, a liquid resin, adhesive, or wax, for example, is absent between the sheet 20 and the wafer 10. Accordingly, in separating the wafer 10 from the sheet 20, there is no possibility that such a liquid resin, adhesive, or wax may be left on each device 12, thereby preventing a degradation in quality of each device 12.

Further, in this preferred embodiment, the raised portion 22 surrounding the outer circumference 10c of the wafer 10 is formed along the outer circumference of the sheet 20 in the thermocompression bonding step. Accordingly, the wafer 10 can be supported more stably in grinding the back side 10b of the wafer 10, so that damage to the wafer 10 can be prevented more effectively.

While the sheet 20 is a polyethylene sheet in this preferred embodiment, the present invention is not limited to this configuration. That is, the sheet 20 capable of supporting the wafer 10 without the need for a liquid resin, adhesive, or wax, for example, may be suitably selected from a polyolefin sheet and a polyester sheet. Examples of the polyolefin sheet include a polyethylene (PE) sheet, a polypropylene (PP) sheet, and a polystyrene (PS) sheet. Further, examples of the polyester sheet include a polyethylene terephthalate (PET) sheet and a polyethylene naphthalate (PEN) sheet.

In this preferred embodiment, the sheet 20 is heated to a temperature (120° C. to 140° C.) near the melting point of a polyethylene sheet in the thermocompression bonding step. However, in the case that the sheet 20 is any thermoplastic polymer sheet other than a polyethylene sheet, the sheet 20 is preferably heated to a temperature near the melting point of the material of the selected sheet. For example, in the case that the sheet 20 is a polypropylene sheet, the sheet 20 is preferably heated to a temperature in the range of 160° C. to 180° C. In the case that the sheet 20 is a polystyrene sheet, the sheet 20 is preferably heated to a temperature in the range of 220° C. to 240° C. Further, in the case that the sheet 20 is a polyethylene terephthalate sheet, the sheet 20 is preferably heated to a temperature in the range of 250° C. to 270° C. In the case that the sheet 20 is a polyethylene naphthalate sheet, the sheet 20 is preferably heated to a temperature in the range of 160° C. to 180° C.

While the substrate 30 is formed of polyethylene terephthalate in this preferred embodiment, the present invention is not limited to this configuration. That is, the substrate 30 may be any support substrate having rigidity allowing the transfer of the wafer 10 without damage thereto after performing the back processing step. Examples of such a support substrate include a glass substrate, aluminum substrate, ceramic substrate, and polyimide resin substrate. In the case that the sheet 20 is formed of polyethylene and the substrate 30 is formed of polyethylene terephthalate as in this preferred embodiment, the sheet 20 is preferably heated to a temperature in the range of 120° C. to 140° C. near the melting point of polyethylene. However, in the case that the sheet 20 is formed of polyethylene terephthalate, the sheet 20 must be heated to a temperature in the range of 250° C. to 270° C. near the melting point of polyethylene terephthalate, which is higher than the heating temperature for a polyethylene sheet. Accordingly, in this case, the substrate 30 is preferably formed of glass, aluminum, ceramic, or polyimide resin, for example, as a material resistant to high temperature. In other words, the substrate 30 is preferably formed of a material having a melting point higher than that of the material of the sheet 20.

Figure 6A:
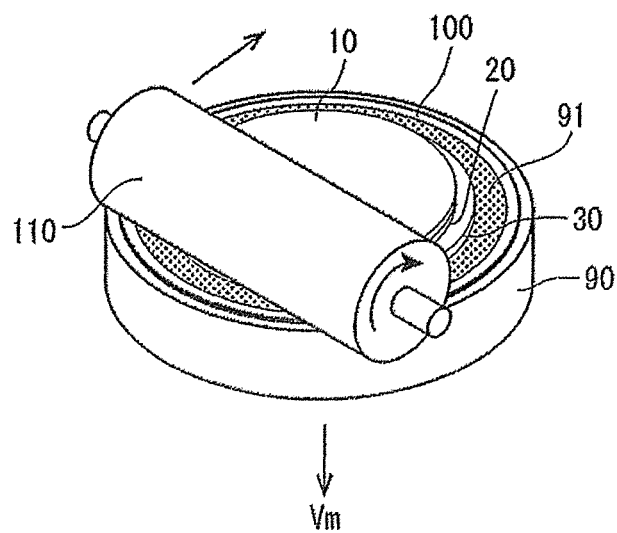
FIG. 6A is a perspective view illustrating a thermocompression bonding step according to a modification of this preferred embodiment.
Figure 6B:
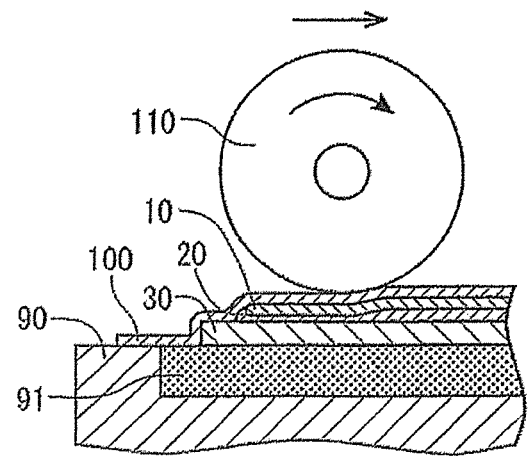
FIG. 6B is an enlarged sectional view of an essential part of FIG. 6A.

While the enclosing cover member 62 is used to form an enclosed environment in this preferred embodiment, the present invention is not limited to this configuration. For example, a modification may be made as illustrated in FIGS. 6A and 6B. In this modification, a chuck table 90 having a vacuum chuck 91 is used, in which the vacuum chuck 91 has a diameter larger than that of the substrate 30. The wafer 10 is placed through the sheet 20 on the substrate 30, and the substrate 30 is held on the vacuum chuck 91 of the chuck table 90. Furthermore, the whole upper surface of the vacuum chuck 91 holding the substrate 30 is covered with a film member 100. That is, all of the wafer 10, the sheet 20, the substrate 30, and the exposed upper surface of the vacuum chuck 91 are fully covered with the film member 10. In this condition, suction means (not illustrated) is operated to apply a vacuum Vm to the vacuum chuck 91, thereby evacuating the inside space of an enclosed environment formed by the film member 100 in cooperation with the upper surface of the vacuum chuck 91. FIG. 6B is an enlarged sectional view of an essential part of the configuration illustrated in FIG. 6A. As illustrated in FIG. 6B, a roller 110 including heating means (not illustrated) is used to apply a pressure to the whole of the back side 10b of the wafer 10 through the film member 100 as heating the sheet 20 to a desired temperature, thereby performing the thermocompression bonding step.

While the back processing step is the step of grinding the back side 10b of the wafer 10 in this preferred embodiment, the present invention is not limited to this configuration. For example, the back processing step in the present invention may be a step of polishing the back side 10b of the wafer 10. Also in this case, an effect similar to that of the above preferred embodiment can be exhibited.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method for processing a back side of a wafer having a plurality of devices on a front side thereof, the plurality of devices being separated from each other by a plurality of crossing division lines formed on the front side of the wafer, a plurality of bumps being provided on a front side of each of the plurality of devices, the wafer processing method comprising:
    a thermoplastic polymer sheet preparing step of preparing a thermoplastic polymer sheet that has an upper surface and a lower surface;
    a wafer providing step of placing the lower surface of the thermoplastic polymer sheet on an upper surface of a substrate for supporting the wafer, and then placing the wafer on the upper surface of the thermoplastic polymer sheet in a condition where the back side of the wafer is exposed upward;
    a thermocompression bonding step of setting the wafer placed through the thermoplastic polymer sheet on the substrate in an enclosed environment after performing the wafer providing step, next evacuating the enclosed environment, and next applying a uniform pressure by a pressure applying plate to the whole back side of the wafer while heating the thermoplastic polymer sheet to the extent that that thermoplastic polymer sheet softens, thereby embedding the plurality of bumps in the softened thermoplastic polymer sheet and uniting the wafer through the thermoplastic polymer sheet to the substrate by thermocompression bonding,
    a back processing step of processing the back side of the wafer after performing the thermocompression bonding step; and
    a separating step of separating the wafer from the thermoplastic polymer sheet after performing the back processing step, wherein the separating step includes cooling the thermoplastic polymer sheet to reduce adhesion between the wafer and the thermoplastic polymer sheet.

2. The wafer processing method according to claim 1, wherein the back processing step comprises a grinding step of grinding the back side of the wafer.

3. The wafer processing method according to claim 1, wherein the thermoplastic polymer sheet is formed of a material selected from the group consisting of polyolefin and polyester.

4. The wafer processing method according to claim 3, wherein the thermoplastic polymer sheet comprises a polyolefin sheet formed of a material selected from the group consisting of polyethylene, polypropylene, and polystyrene.

5. The wafer processing method according to claim 4, wherein the polyolefin sheet is formed of polyethylene, and the polyolefin sheet is heated to a temperature in the range of 120° C. to 140° C. in the thermocompression bonding step.

6. The wafer processing method according to claim 4, wherein the polyolefin sheet is formed of polypropylene, and the polyolefin sheet is heated to a temperature in the range of 160° C. to 180° C. in the thermocompression bonding step.

7. The wafer processing method according to claim 4, wherein the polyolefin sheet is formed of polystyrene, and the polyolefin sheet is heated to a temperature in the range of 220° C. to 240° C. in the thermocompression bonding step.

8. The wafer processing method according to claim 3, wherein the thermoplastic polymer sheet comprises a polyester sheet formed of a material selected from the group consisting of polyethylene terephthalate and polyethylene naphthalate.

9. The wafer processing method according to claim 8, wherein the polyester sheet is formed of polyethylene terephthalate, and the polyester sheet is heated to a temperature in the range of 250° C. to 270° C. in the thermocomprssion bonding step.

10. The wafer processing method according to claim 8, wherein the polyester sheet is formed of polyethylene naphthalate, and the polyester sheet is heated to a temperature in the range of 160° C. to 180° C. in the thermocompression bonding step.

11. The wafer processing method according to claim 1, wherein a pressure is applied to the wafer such that a raised portion surrounding an outer circumference of the wafer is formed along an outer circumference of the thermoplastic polymer sheet in the thermocompression bonding step.

12. The wafer processing method according to claim 1, wherein during the thermocompression bonding step, air previously present near each of the bumps is completely sucked off, and accordingly, the wafer is tightly bonded through the thermoplastic polymer sheet to the substrate.

13. A wafer processing method for processing a back side of a wafer having a plurality of devices on a front side thereof, the plurality of devices being separated from each other by a plurality of crossing division lines formed on the front side of the wafer, a plurality of bumps being provided on a front side of each of the plurality of devices, the wafer processing method comprising:
  a wafer providing step of placing a thermoplastic polymer sheet on an upper surface of a substrate for supporting the wafer, and placing the wafer on an upper surface of the thermoplastic polymer sheet in a condition where the back side of the wafer is exposed upward, wherein the substrate is formed of a resin;
  a thermocompression bonding step of setting the wafer placed through the thermoplastic polymer sheet on the substrate in an enclosed environment after performing the wafer providing step, next evacuating the enclosed environment, and next applying a uniform pressure by a pressure applying plate to the whole back side of the wafer while heating the thermoplastic polymer sheet to the extent that that thermoplastic polymer sheet softens thereby embedding the plurality of bumps in the softened thermoplastic polymer sheet and uniting the wafer through the polymer sheet to the substrate by thermocompression bonding to simultaneously bond: (i) the upper surface of the thermoplastic polymer sheet to the front side of the wafer, and (ii) a lower surface of the thermoplastic polymer sheet to the upper surface of the substrate;
  a back processing step of processing the back side of the wafer after performing the thermocompression bonding step; and
  a separating step of separating the wafer from the thermoplastic polymer sheet after performing the back processing step, wherein the separating step includes heating the thermoplastic polymer sheet to reduce adhesion between the wafer and the thermoplastic polymer sheet, and further wherein the separating step includes separating the substrate and the thermoplastic polymer sheet together from the wafer by bending the substrate,
  wherein the wafer is bonded to the substrate via the thermoplastic polymer sheet by performing the thermocompression bonding step, without the use of a liquid resin, an adhesive, or a wax.

14. The wafer processing method according to claim 13, wherein the back processing step comprises a grinding step of grinding the back side of the wafer.

15. The wafer processing method according to claim 13, wherein the thermoplastic polymer sheet is formed of a material selected from the group consisting of polyolefin and polyester.

16. The wafer processing method according to claim 15, wherein the thermoplastic polymer sheet comprises a polyolefin sheet formed of a material selected from the group consisting of polyethylene, polypropylene, and polystyrene.

17. The wafer processing method according to claim 16, wherein the polyolefin sheet is formed of polyethylene, and the polyolefin sheet is heated to a temperature in the range of 120° C. to 140° C. in the thermocompression bonding step.

18. The wafer processing method according to claim 16, wherein the polyolefin sheet is formed of polypropylene, and the polyolefin sheet is heated to a temperature in the range of 160° C. to 180° C. in the thermocompression bonding step.

19. The wafer processing method according to claim 16, wherein the polyolefin sheet is formed of polystyrene, and the polyolefin sheet is heated to a temperature in the range of 220° C. to 240° C. in the thermocompression bonding step.

20. The wafer processing method according to claim 15, wherein the thermoplastic polymer sheet comprises a polyester sheet formed of a material selected from the group consisting of polyethylene terephthalate and polyethylene naphthalate.

21. The wafer processing method according to claim 20, wherein the polyester sheet is formed of polyethylene terephthalate, and the polyester sheet is heated to a temperature in the range of 250° C. to 270° C. in the thermocomprssion bonding step.

22. The wafer processing method according to claim 20, wherein the polyester sheet is formed of polyethylene naphthalate, and the polyester sheet is heated to a temperature in the range of 160° C. to 180° C. in the thermocompression bonding step.

23. The wafer processing method according to claim 20, wherein a pressure is applied to the wafer such that a raised portion surrounding an outer circumference of the wafer is formed along an outer circumference of the thermoplastic polymer sheet in the thermocompression bonding step.

24. The wafer processing method according to claim 13, wherein during the thermocompression bonding step, air previously present near each of the bumps is completely sucked off, and accordingly, the wafer is tightly bonded through the thermoplastic polymer sheet to the substrate.

* * * * *

UNITED STATES PATENT AND TRADEMARK OFFICE
CERTIFICATE OF CORRECTION

PATENT NO. : 11,450,548 B2
APPLICATION NO. : 16/421556
DATED : September 20, 2022
INVENTOR(S) : Kiuchi et al.

It is certified that error appears in the above-identified patent and that said Letters Patent is hereby corrected as shown below:

In the Claims

Column 11, Line 2, Claim 9, delete "thermocomprssion" and insert --thermocompression-- therefor.

Column 12, Line 41, Claim 21, delete "thermocomprssion" and insert --thermocompression-- therefor.

Signed and Sealed this
Twenty-eighth Day of March, 2023

Katherine Kelly Vidal
*Director of the United States Patent and Trademark Office*